(12) United States Patent
Lee

(10) Patent No.: US 7,902,557 B2
(45) Date of Patent: Mar. 8, 2011

(54) SEMICONDUCTOR LIGHT EMITTING DEVICE AND A METHOD OF MANUFACTURING THE SAME

(75) Inventor: Jo Young Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 2 days.

(21) Appl. No.: 12/324,400

(22) Filed: Nov. 26, 2008

(65) Prior Publication Data

US 2009/0140281 A1 Jun. 4, 2009

(30) Foreign Application Priority Data

Nov. 30, 2007 (KR) .................. 10-2007-0123830

(51) Int. Cl.
*H01L 27/15* (2006.01)
(52) U.S. Cl. .......... 257/79; 257/49; 257/64; 257/94; 257/E33.001; 438/341; 438/481; 438/484; 438/490; 438/493
(58) Field of Classification Search .............. 257/49, 257/64, 79, 94; 438/341, 481, 484, 490, 438/493
See application file for complete search history.

(56) References Cited

U.S. PATENT DOCUMENTS

| | | | |
|---|---|---|---|
| 2001/0035534 A1* | 11/2001 | Takeya et al. | 257/189 |
| 2004/0124432 A1* | 7/2004 | Ko | 257/99 |
| 2007/0228404 A1* | 10/2007 | Tran et al. | 257/98 |
| 2009/0283782 A1* | 11/2009 | Shakuda | 257/94 |

* cited by examiner

*Primary Examiner* — Wai-Sing Louie
(74) *Attorney, Agent, or Firm* — Birch, Stewart, Kolasch & Birch, LLP

(57) ABSTRACT

Disclosed is a semiconductor light emitting device comprising a seed layer, a first conductive semiconductor layer into which the seed layer is partially inserted, a first electrode electrically connected to the first conductive semiconductor layer, an active layer under the first conductive semiconductor layer, a second conductive semiconductor layer under the active layer, and a second electrode layer under the second conductive semiconductor layer.

18 Claims, 10 Drawing Sheets

SEMICONDUCTOR LIGHT EMITTING DEVICE AND A METHOD OF MANUFACTURING THE SAME

The present application claims priority under 35 U.S.C. 126 to Korean Patent Application No. 10-2007-0123830 (filed on Nov. 30, 2007), which is hereby incorporated by reference in its entirety.

BACKGROUND

The present disclosure relates to a semiconductor light emitting device and a method of manufacturing the same.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

The embodiment provides a semiconductor light emitting device comprising a first conductive semiconductor layer comprising a seed layer and a method of manufacturing the same.

The embodiment provides a semiconductor light emitting device and a method of manufacturing the same, in which a conductive semiconductor layer is grown by a part of a seed layer.

The embodiment provides a semiconductor light emitting device and a method of manufacturing the same, in which a surface of a first conductive semiconductor layer comprises a concave-convex shape.

The embodiment provides a semiconductor light emitting device and a method of manufacturing the same, in which a removal layer is formed between a substrate and a semiconductor layer, and then the removal layer is removed through a wet etching process, so that the substrate is separated from a conductive semiconductor layer.

An embodiment provides a semiconductor light emitting device comprising: a seed layer, a first conductive semiconductor layer into which the seed layer is partially inserted, a first electrode electrically connected to the first conductive semiconductor layer, an active layer under the first conductive semiconductor layer, a second conductive semiconductor layer under the active layer, and a second electrode layer under the second conductive semiconductor layer.

An embodiment provides a semiconductor light emitting device comprising: a first conductive semiconductor layer comprising a concave portion comprising at least one of a strip shape, a matrix shape, a net shape, a circular shape and a polygonal shape, a first electrode on the first conductive semiconductor layer, an active layer under the first conductive semiconductor layer, a second conductive semiconductor layer under the active layer, and a second electrode layer under the second conductive semiconductor layer.

An embodiment provides a method of manufacturing the semiconductor light emitting device comprising: forming a first removal layer having a convex shape on a substrate, forming a seed layer on the first removal layer, forming a second removal layer on the substrate, forming a light emitting structure on the seed layer and the second removal layer, forming a second electrode layer on the light emitting structure, exposing at least one of the first removal layer, the second removal layer and the substrate by performing a MESA etching, separating the substrate by removing the first removal layer and the second removal layer using an etching solution, and forming a first electrode on the light emitting structure separated the substrate.

DETAILED DESCRIPTION OF THE EMBODIMENTS

Figure 1:
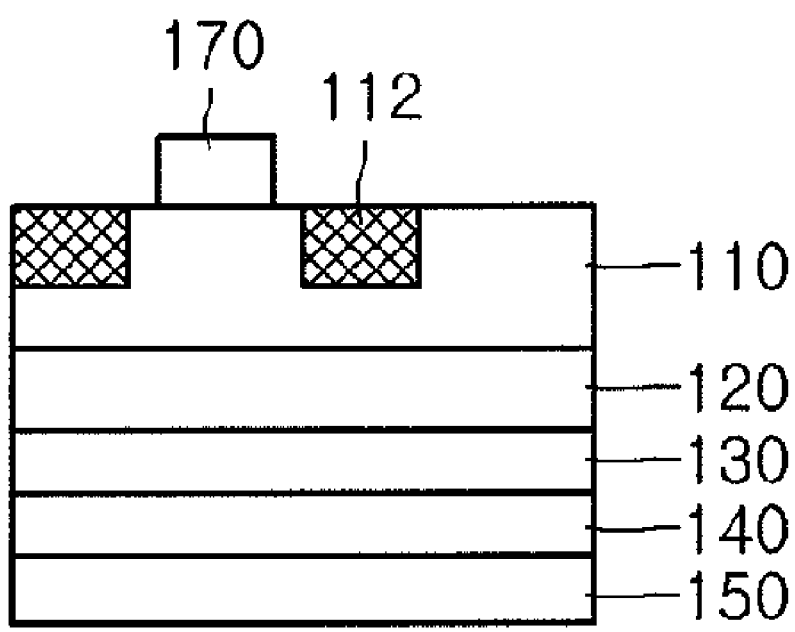
FIG. 1 is a sectional view showing a semiconductor light emitting device according to a first embodiment.

A semiconductor light emitting device and a method of manufacturing the same according to an embodiment will be described in detail with reference to the accompanying drawings. In the description of embodiments, it will be understood that when a layer is referred to as being 'on' or 'under' another layer, the reference about 'on' and 'under' each layer will be made on the basis of drawings. Also, the thickness of each layer in the drawings is an example, and is not limited thereto.

FIG. 1 is a side sectional view showing a semiconductor light emitting device according to a first embodiment.

Referring to FIG. 1, a semiconductor light emitting device 100 comprises a first conductive semiconductor layer 110, a seed layer 112, an active layer 120, a second conductive semiconductor layer 130, a second electrode layer 140, a conductive support member 150 and a first electrode 170.

The first conductive semiconductor layer 110 comprises at least one semiconductor layer doped with a first conductive dopant. If the first conductive semiconductor layer 110 is an N-type semiconductor layer, the first conductive semiconductor layer 110 comprises group III-V compound semiconductor, such as GaN, InN, AlN, InGaN, AlGaN, InAlGaN or AlInN. The first conductive semiconductor layer 110 may serve as a first electrode contact layer. If the first conductive dopant is an N type dopant, the first dopant comprises at least one selected from the group consisting of Si, Ge, Sn, Se and Te.

The first electrode 170 having a predetermined pattern is formed on the first conductive semiconductor layer 110. The first electrode 170 comprises at least one layer and is formed in various patterns.

At least one seed layer 112 is formed on the first conductive semiconductor layer 110. The seed layer 112 serves as a seed of the first conductive semiconductor layer 110, and is partially inserted into the first conductive semiconductor layer 110. A surface of the seed layer 112 is exposed at a surface of the first conductive semiconductor layer 110.

The seed layer 112 is aligned on the same plane with the surface of the first conductive semiconductor layer 110. The seed layer 112 is formed in various patterns comprising a circle and a polygon, such as a hexagon. The seed layer 112 is formed along the surface of the first conductive semiconductor layer 110 in various shapes, such as a stripe, a matrix, a net, a circle, a polygon, etc. The embodiment does not limit the pattern and shape of the seed layer 112. In addition, a plurality of seed layers 112 are spaced apart from each other at regular intervals or irregular intervals.

The seed layer 112 comprises an undoped semiconductor layer. The undoped semiconductor layer comprises at least one semiconductor selected from the group consisting of GaN, InN, AlN, InGaN, AlGaN, InAlGaN and AlInN, which is not doped with conductive dopants.

The seed layer 112 has a thickness of a several Å to a several um. A roughness having a predetermined shape is formed on an upper surface of the seed layer 112 and/or the first conductive semiconductor layer 110.

The active layer 120 is formed under the first conductive semiconductor layer 110. The active layer 120 is formed in a single quantum well structure or a multiple quantum well structure, and comprises InGaN/GaN or AlGaN/GaN. The active layer 120 comprises material having a predetermined band gap energy corresponding to a wavelength of light to be emitted. For example, when light of blue color having a wavelength of 460 to 470 nm is emitted, the active layer 120 has a single quantum well structure or a multiple quantum structure, in which an InGaN well layer and a GaN wall layer form a single period. The active layer 120 comprises material for emitting color light having a wavelength of blue, red and green.

A conductive clad layer may be formed on and/or under the active layer 120. The conductive clad layer comprises an AlGaN based layer.

The second conductive semiconductor layer 130 is formed under the active layer 120. The second conductive semiconductor layer 130 comprises at least one semiconductor layer doped with a second conductive dopant. If the second conductive semiconductor layer 130 is a P-type semiconductor layer, the second conductive semiconductor layer 130 comprises at least one selected from III-V group compound semiconductor, such as GaN, InN, AlN, InGaN, AlGaN, InAlGaN or AlInN. If the second conductive dopant is a P type dopant, the second dopant comprises at least one selected from the group consisting of Mg, Zn, Ca, Sr and Ba.

A third conductive semiconductor layer (not shown) and/or a transparent electrode layer (not shown) may be formed under the second conductive semiconductor layer 130. The third conductive semiconductor layer comprises a semiconductor layer doped with a first conductive dopant. The transparent electrode layer comprises at least one selected from the group consisting of ITO, ZnO, IrOx, RuOx and NiO.

If the first conductive semiconductor layer 110 is the n-type semiconductor layer, the second conductive semiconductor layer 130 is the p-type semiconductor layer and vice versa. A light emitting structure may have an N-P junction structure, a P-N junction structure, an N-P-N junction structure, or a P-N-P junction structure.

The second electrode layer 140 is formed under the second conductive semiconductor layer 130. The second electrode layer 140 comprises material having reflective properties, for example, the second electrode layer 140 comprises at least one selected from the group consisting of Al, Ag, Pd, Rh, Pt and an alloy thereof. The second electrode layer 140 comprises material having a superior ohmic contact property and a superior seed metal property.

The conductive support member 150 is formed under the second electrode layer 140. The conductive support member 150 comprises at least one selected from the group consisting of copper, gold and a carrier wafer, for example, Si, Ge, GaAs, ZnO and SiC and serves as a base substrate. The second electrode layer 140 and the conductive support member 150 may serve as a second electrode having a single layer structure or a multiple layer structure, the embodiment is not limited thereto.

FIGS. 2 to 9 are views showing a process for manufacturing the semiconductor light emitting device according to the first embodiment.

Figure 2:
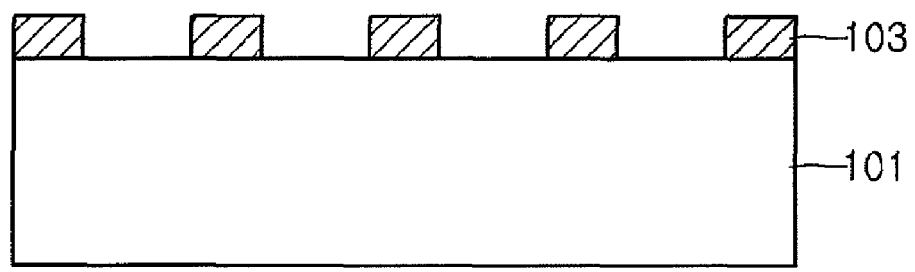
FIGS. 2 to 9 are views showing a process for manufacturing the semiconductor light emitting device according to the first embodiment.

Referring to FIG. 2, a first removal layer 103 is formed on a substrate 101. The substrate 101 is formed by using at least one selected from the group consisting of sapphire ($Al_2O_3$), SiC, Si, GaAs, GaN, ZnO, GaP, InP and Ge. The substrate 101 has insulating properties. A concave-convex pattern may be formed on and/or under the substrate 101. The concave-convex pattern has a strip shape, a lens shape, a column shape or a horn shape.

The first removal layer 103 is formed on the substrate 101 in a concave-convex structure. For example, the first removal layer 103 is formed using a mask pattern or a thin film etching process. The substrate 101 is exposed through a concave portion of the first removal layer 103. The first removal layer 103 has the same pattern as that of the seed layer 112.

Although the first removal layer 103 is selected from the group consisting of $SiO_2$, $Si_3N_4$, $Al_2O_3$ and $TiO_2$, and has a thickness of a several Å to a several um. However, the embodiment is not limited thereto.

After a buffer layer (not shown) has been formed on the substrate 101, the first removal layer 103 is formed. The buffer layer relieves a lattice mismatching between GaN material and substrate material, and comprises at least one selected from the group consisting of GaN, InN, AlN, InGaN, AlGaN, InAlGaN and AlInN. The buffer layer has a thickness of several hundreds Å, for example, 200~500 Å. If the buffer layer is formed on the substrate 101, the buffer layer is exposed through the concave portion of the first removal layer 103.

Figure 3:
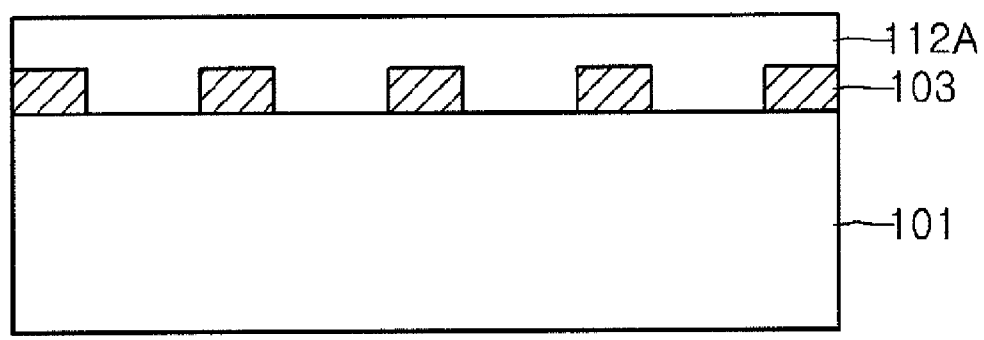

Referring to FIG. 3, a seed layer 112A is formed on the substrate 101 and the first removal layer 103. The seed layer 112A comprises an undoped semiconductor layer, for example, the seed layer 112A comprises at least one selected from the group consisting of GaN, InN, AlN, InGaN, AlGaN, InAlGaN and AlInN, which are not doped with conductive dopants. If the seed layer 112A comprises an undoped GaN layer, the seed layer 112A can be formed by supplying $NH_3$ and TMGa at a predetermined growth temperature. In the initial stage, the seed layer 112A is grown on the substrate 101, and then the seed layer 112A is formed on the substrate 101 and the first removal layer 103.

If the buffer layer (not shown) is formed on the substrate 101, the seed layer 112A is formed on the buffer layer.

Figure 4:
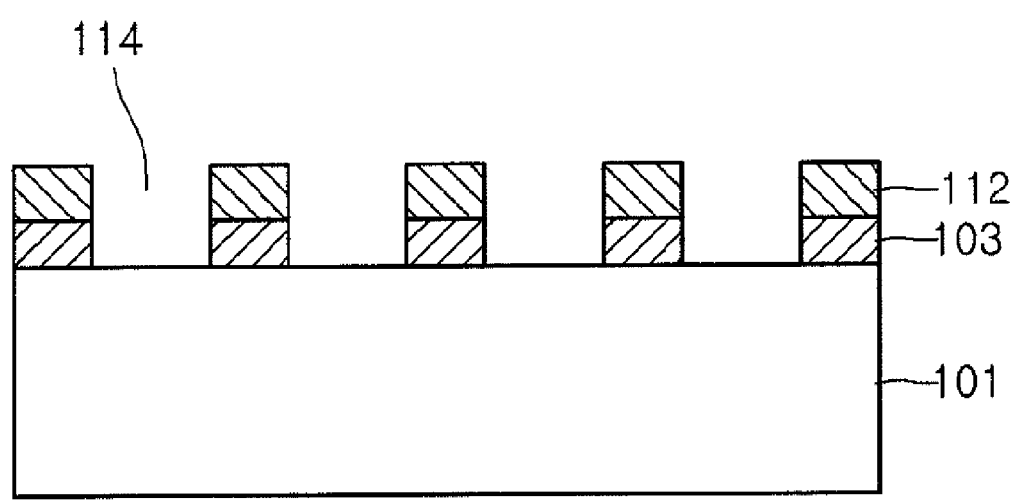

Referring to FIGS. 3 and 4, a region 114 of the seed layer 112A corresponding to the substrate 101 is removed through an etching process, for example, a dry etching process, and a region of the seed layer 112A corresponding to the first removal layer 103 remains. Since the region 114 of the seed layer 112A corresponding to the substrate 101 is formed in a groove shape, a part of the substrate 101 is exposed.

The seed layer 112 formed on the first removal layer 103 serves as a seed, which allows nitride semiconductors to be grown. The first removal layer 103 and the seed layer 112 are formed with a pattern having a circular shape or a polygonal shape. In addition, the seed layer 112 has a stripe shape, a matrix shape, a net shape, a circular shape or a polygonal shape, and the shape of the seed layer 112 is not limited thereto.

Figure 5:
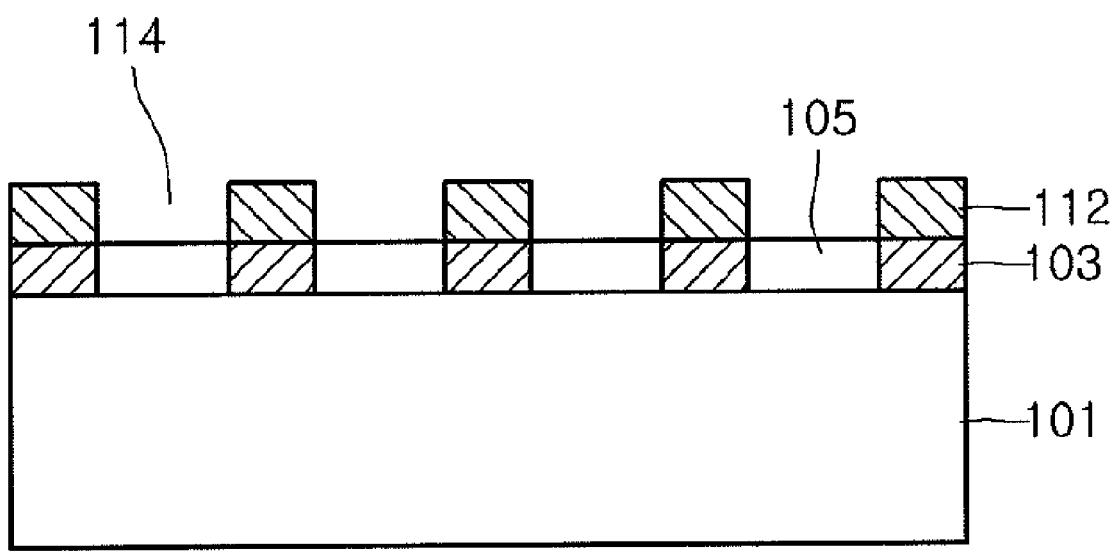

Referring to FIGS. 4 and 5, a second removal layer 105 is formed on the substrate 101. The second removal layer 105 has a thickness identical to that of the first removal layer 103. Otherwise, the second removal layer 105 has a thickness thicker than or thinner than that of the first removal layer 103. The second removal layer 105 comprises material identical to or different from that of the first removal layer 103.

The second removal layer 105 is formed at the region 114 between the seed layers 112 and comprises at least one selected from the group consisting of $SiO_2$, $Si_3N_4$, $Al_2O_3$ and $TiO_2$. The second removal layer 105 has a thickness of a several Å to a several um. The material and the thickness of the second removal layer 105 are not limited thereto.

The first removal layer 103 and the second removal layer 105 prevent defects occurring between the substrate 101 and the GaN material, so that the defect density of the conductive semiconductor layer is lowered.

Figure 6:
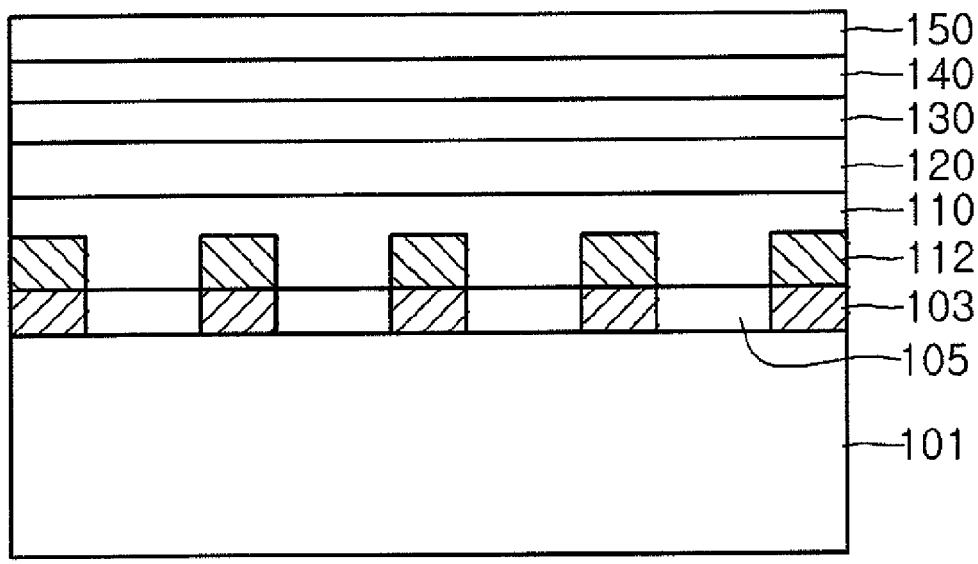

Referring to FIGS. 5 and 6, the first conductive semiconductor layer 110 is formed on the seed layer 112 and the second removal layer 105. A lower surface of the first conductive semiconductor layer 110 has a concave-convex shape, and may be changed depending on a thickness of the seed layer 112 and the second removal layer 105.

In the initial growth of the first conductive semiconductor layer 110, the first conductive semiconductor layer 110 is formed on the seed layer 112, and then the first conductive semiconductor layer 110 is formed on the seed layer 112 and the second removal layer 105. The first conductive semiconductor layer 110 may have a thickness thicker than that of the seed layer 112.

The first conductive semiconductor layer 110 comprises at least one semiconductor layer doped with a first conductive dopant. If the first conductive semiconductor layer 110 is an N-type semiconductor layer, the first conductive semiconductor layer 110 comprises at least one selected from III-V group compound semiconductor, such as GaN, InN, AlN, InGaN, AlGaN, InAlGaN or AlInN. The first conductive semiconductor layer 110 may serve as a first electrode contact layer. If the first conductive dopant is an N type dopant, the first conductive dopant comprises at least one selected from the group consisting of Si, Ge, Sn, Se and Te.

The active layer 120 is formed on the first conductive semiconductor layer 110. The active layer 120 has a structure comprising a single quantum well or a multiple quantum well. The active layer 120 comprises InGaN/GaN or AlGaN/GaN. The active layer 120 comprises material having a predetermined band gap energy corresponding to a wavelength of light to be emitted. For example, when light of blue color having a wavelength of 460 to 470 nm is emitted, the active layer 120 has a single quantum well structure or a multiple quantum structure, in which an InGaN well layer and a GaN well layer form a single period. The active layer 120 comprises material for emitting color light having a wavelength of blue, red and green.

A conductive clad layer may be formed on and/or under active layer 120. The conductive clad layer comprises an AlGaN based layer.

The second conductive semiconductor layer 130 is formed on the active layer 120. The second conductive semiconductor layer 130 comprises at least one semiconductor layer doped with a second conductive dopant. If the second conductive semiconductor layer 130 is a P-type semiconductor layer, the second conductive semiconductor layer 130 comprises at least one selected from III-V group compound semiconductor, such as GaN, InN, AlN, InGaN, AlGaN, InAlGaN or AlInN. If the second conductive dopant is a P type dopant, the second dopant comprises at least one selected from the group consisting of Mg, Zn, Ca, Sr and Ba.

A third conductive semiconductor layer (not shown) and/or a transparent electrode layer (not shown) may be formed on the second conductive semiconductor layer 130. The third conductive semiconductor layer comprises a semiconductor layer doped with a first conductive dopant. The transparent electrode layer comprises at least one selected from the group consisting of ITO, ZnO, IrOx, RuOx and NiO.

If the first conductive semiconductor layer 110 is the n-type semiconductor layer, the second conductive semiconductor layer 130 is the p-type semiconductor layer, and vice versa. A light emitting structure may comprise an N-P junction structure, a P-N junction structure, an N-P-N junction structure, and a P-N-P junction structure.

The second electrode layer 140 is formed at a local area or the entire area of an upper part of the second conductive semiconductor layer 130. The second electrode layer 140 comprises material having reflective properties, for example, the second electrode layer 140 comprises at least one selected from the group consisting of Al, Ag, Pd, Rh, Pt and an alloy thereof. The second electrode layer 140 comprises material having a superior ohmic contact property and a superior seed metal property.

Figure 7:
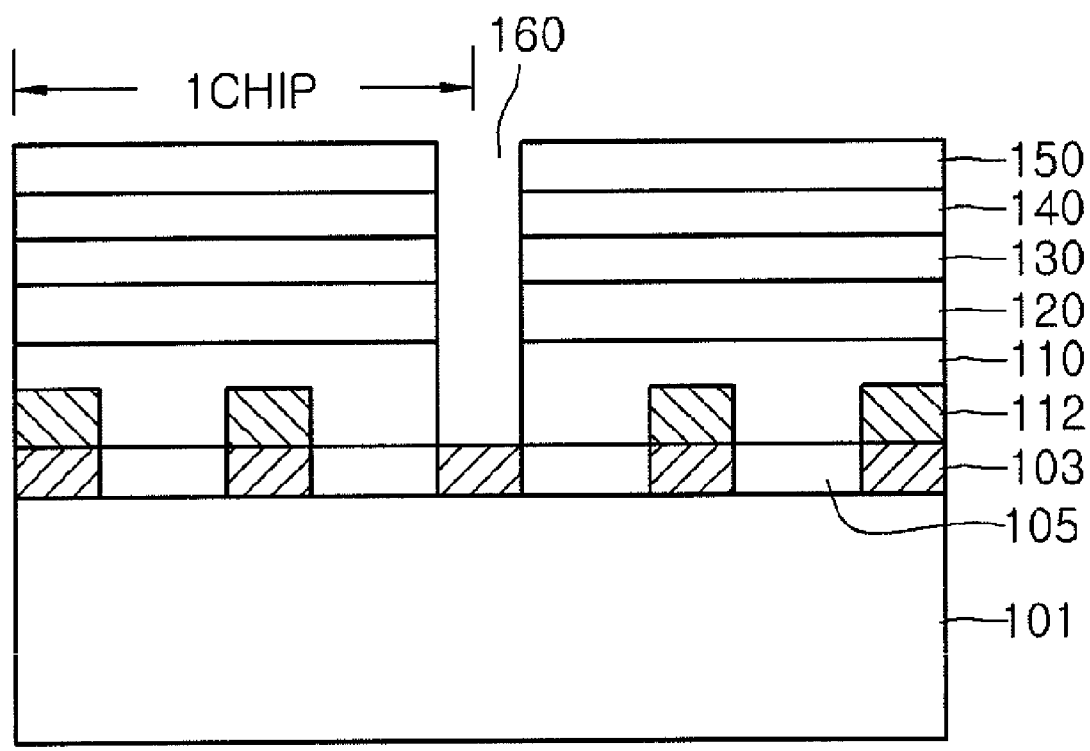

Referring to FIGS. 6 and 7, a MESA etching is performed on a chip boundary area The first removal layer 103 and/or the substrate 101 is exposed through the area subject to the MESA etching.

A part of the first removal layer 103 and/or the second removal layer 105 serves as the chip boundary area, and the size of chips is changed according to the chip boundary area.

Figure 8:
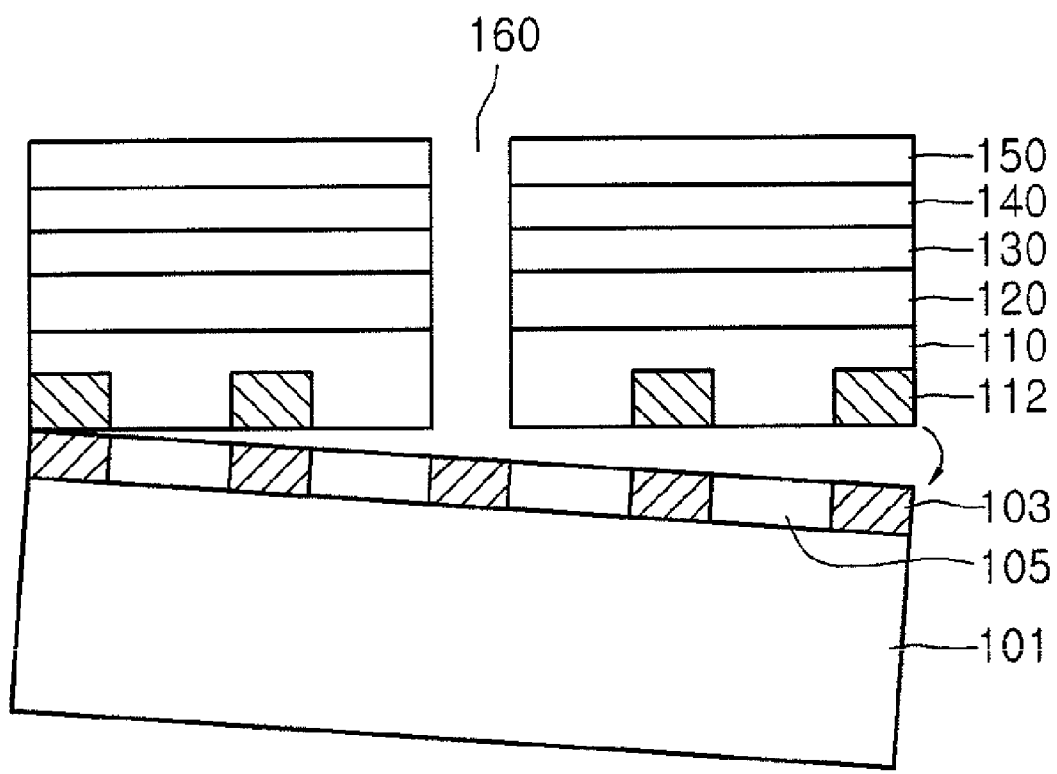

Referring to FIGS. 7 and 8, after the MESA etching is performed, the conductive support member 150 is formed on the second electrode layer 140. The conductive support member 150 comprises at least one selected from the group consisting of copper, gold and a carrier wafer, for example, Si, Ge, GaAs, ZnO and SiC.

If the conductive support member 150 is formed through an electrolytic plating process, the conductive support member 150 is exclusively formed on the second electrode 140. Although the second electrode layer 140 and the conductive support member 150 may serve as a second electrode having a single layer structure or a multiple layer structure, the embodiment is not limited thereto.

The MESA etching is performed after the second electrode layer 140 and the conductive support member 150 have been formed. The chip boundary area of the conductive support member 150 is formed through a wet etching process, and the MESA etching is performed on the chip boundary area. In addition, after the second conductive semiconductor layer 130 has been formed, the MESA etching is performed. Then, the second electrode layer 140 and the conductive support member 150 are formed.

In addition, wet etchant is injected into a MESA etching area 160, so that the first removal layer 103 and the second removal layer 105 are removed by the wet etchant. BOE (Buffered Oxide Etchant) and HF can be used as the wet etchant.

When the first removal layer 103 and the second removal layer 105 are removed, the first conductive semiconductor layer 110 is separated from the substrate 101 disposed under the first conductive semiconductor layer 110 as an individual chip unit. Since the substrate 101 is separated without using a physical scheme, such as, a laser lift off, the semiconductor layer is not damaged by laser.

The seed layer 112 can exists under the first conductive semiconductor layer 110. The seed layer 112 may comprises at least one of a convex shape and concave-convex shape.

Figure 9:
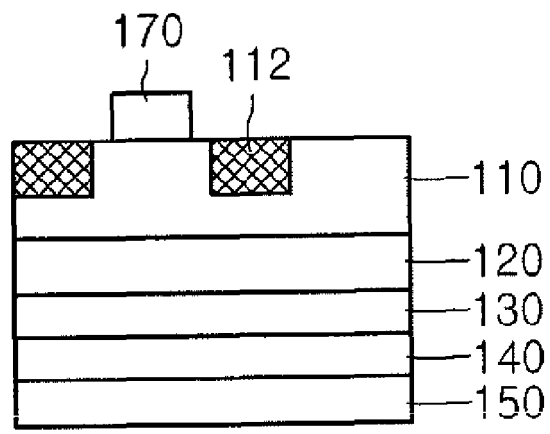

As shown in FIG. 9, the conductive support member 150 is disposed on a base, and then the first electrode 170 having a predetermined pattern is formed at an upper surface of the first conductive semiconductor layer 110. The first electrode 170 can be formed on the first conductive semiconductor layer 110 and the seed layer 112.

Since at least one seed layer 112 is inserted into the upper surface of the first conductive semiconductor layer 110, the seed layer 112 serves as a medium different from the first conductive semiconductor layer 110, so that light emitting efficiency of the semiconductor light emitting device is improved.

Figure 10:
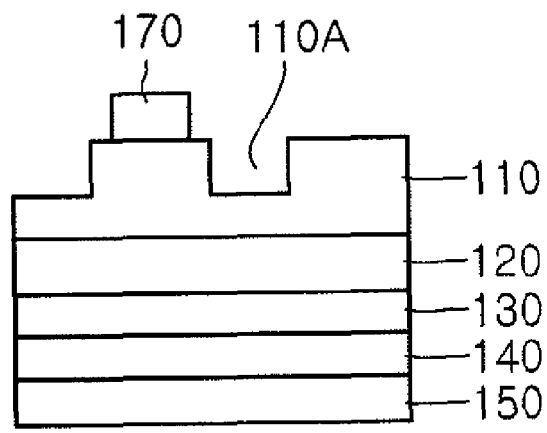
FIG. 10 is a side sectional view showing a semiconductor light emitting device according to a second embodiment.

FIG. 10 is a side sectional view showing a semiconductor light emitting device according to a second embodiment. In the second embodiment, the same reference numerals will be assigned to the same elements of the first embodiment and detailed description thereof will be omitted in order to avid redundancy.

As shown in FIG. 10, a semiconductor light emitting device 100A has a concave portion 110A formed on the first conductive semiconductor layer 110. The concave portion 110A is formed by removing the seed layer 112 from the structure shown in FIG. 1. The seed layer (112 shown in FIG. 1) is removed through a dry etching. At this time, a part of the seed layer (112 shown in FIG. 1), for instance, an upper portion of the seed layer is removed or a part of the seed layer having a predetermined pattern is removed.

Figure 11:
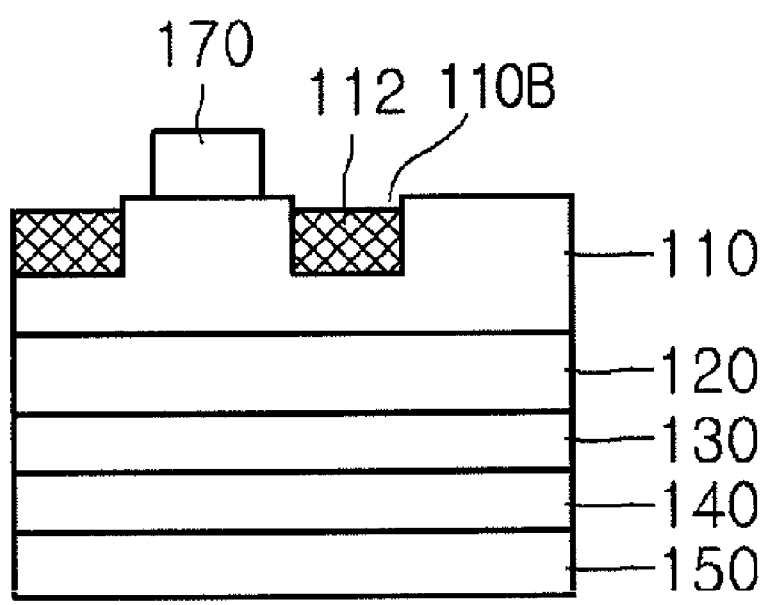
FIG. 11 is a side sectional view showing a semiconductor light emitting device according to a third embodiment.

FIG. 11 is a side sectional view showing a semiconductor light emitting device according to a third embodiment. In the third embodiment, the same reference numerals will be assigned to the same elements of the first embodiment and detailed description thereof will be omitted in order to avid redundancy.

As shown in FIG. 11, in a semiconductor light emitting device 100B, the seed layer 112 having a stepped portion is formed on a concave portion 110B of the first conductive semiconductor layer 110. If the second removal layer 105 is formed in a thickness thinner than that of the first removal layer 103, the seed layer 112 forms a stepped portion with respect to the upper surface of the first conductive semiconductor layer 110.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
    a seed portion;
    a first conductive semiconductor layer into which the seed portion is partially embedded, and having a surface that exposes the seed portion;
    a first electrode on the surface of the first conductive semiconductor layer;
    an active layer under the first conductive semiconductor layer;
    a second conductive semiconductor layer under the active layer; and
    a second electrode under the second conductive semiconductor layer, and comprising at least one of reflective materials and a conductive support member.

2. The semiconductor light emitting device as claimed in claim 1, wherein a lower surface of the seed portion comprises a circular shape or a polygonal shape.

3. The semiconductor light emitting device as claimed in claim 1, wherein an upper surface of the seed portion is aligned on a same plane with an upper surface of the first conductive semiconductor layer, or is aligned on a plane different from the upper surface of the first conductive semiconductor layer.

4. The semiconductor light emitting device as claimed in claim 1, wherein the seed portion comprises an undoped semiconductor layer.

5. The semiconductor light emitting device as claimed in claim 1, wherein the seed portion is formed along the first conductive semiconductor layer in at least one of a strip shape, a matrix shape, a net shape, a circular shape and a polygonal shape.

6. A semiconductor light emitting device comprising:
    a first conductive semiconductor layer comprising a concave portion comprising at least one of a strip shape, a matrix shape, a net shape, a circular shape and a polygonal shape;
    a first electrode on the first conductive semiconductor layer;
    an active layer under the first conductive semiconductor layer;
    a second conductive semiconductor layer under the active layer; and
    a second electrode under the second conductive semiconductor layer, and comprising at least one of reflective materials and a conductive support member.

7. The semiconductor light emitting device as claimed in claim 6, comprising an undoped semiconductor layer partially formed the concave portion of the first conductive semiconductor layer.

8. The semiconductor light emitting device as claimed in claim 6, wherein the first conductive semiconductor layer comprises at least one concave portion, and the concave portion has a depth smaller than a thickness of the first conductive semiconductor layer.

9. The semiconductor light emitting device as claimed in claim 6, comprising a seed portion is formed in the concave portion of the first conductive semiconductor layer and the seed portion comprises at least one of a strip shape, a matrix shape, a net shape, a circular shape and a polygonal shape.

10. The semiconductor light emitting device as claimed in claim 6, wherein the first conductive semiconductor layer comprises an N type semiconductor layer or a P type semiconductor layer.

11. The semiconductor light emitting device as claimed in claim 7, wherein the first conductive semiconductor layer and the seed portion have a roughness.

12. The semiconductor light emitting device as claimed in claim 1, wherein the seed portion is formed at regular intervals or irregular intervals.

13. The semiconductor light emitting device as claimed in claim 1, wherein the seed portion has a thickness of 1 Å~9 µm.

14. The semiconductor light emitting device as claimed in claim 9, wherein an upper surface of the seed portion is aligned on a plane different from the upper surface of the first conductive semiconductor layer.

15. The semiconductor light emitting device as claimed in claim 6, wherein the seed portion comprises at least one of GaN, InN, AlN, InGaN, AlGaN, InAlGaN, and AlInN.

16. The semiconductor light emitting device as claimed in claim 6, wherein a surface of the seed portion is exposed on the first conductive semiconductor layer.

17. The semiconductor light emitting device as claimed in claim 6, wherein the second electrode is formed at a local area of a lower part of the second conductive semiconductor layer.

18. The semiconductor light emitting device as claimed in claim 6, wherein the second electrode comprises material having an ohmic contact and a seed metal.

* * * * *